(12) United States Patent
Ebihara

(10) Patent No.: US 11,290,674 B1
(45) Date of Patent: Mar. 29, 2022

(54) COLUMN AMPLIFIER CAPACITOR SWITCH CIRCUIT TO ADJUST ANALOG GAIN

(71) Applicant: OMNIVISION TECHNOLOGIES, INC., Santa Clara, CA (US)

(72) Inventor: Hiroaki Ebihara, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/127,571

(22) Filed: Dec. 18, 2020

(51) Int. Cl.
*H04N 5/378* (2011.01)
*H01L 27/146* (2006.01)
*H04N 5/374* (2011.01)
*H04N 5/3745* (2011.01)

(52) U.S. Cl.
CPC ....... *H04N 5/378* (2013.01); *H01L 27/14612* (2013.01); *H01L 27/14645* (2013.01); *H04N 5/37455* (2013.01)

(58) Field of Classification Search
CPC ................ H04N 5/378; H04N 5/37455; H01L 27/14612; H01L 27/14645
See application file for complete search history.

(56) References Cited

U.S. PATENT DOCUMENTS

| | | | | |
|---|---|---|---|---|
| 2005/0237401 | A1* | 10/2005 | Tan ....................... | G01J 3/0259 348/255 |
| 2013/0187027 | A1* | 7/2013 | Qiao ..................... | H04N 5/351 250/208.1 |
| 2019/0123691 | A1* | 4/2019 | Puttananjegowda .. | G01N 33/49 |
| 2020/0396403 | A1* | 12/2020 | Ebihara ................ | H04N 5/3658 |

OTHER PUBLICATIONS

Ebihara et al., U.S. Appl. No. 16/516,097, filed Jul. 18, 2019, 43 pages.
Ebihara et al., U.S. Appl. No. 16/900,576, filed Jun. 12, 2020, 46 pages.

* cited by examiner

*Primary Examiner* — Abdelaaziz Tissire
(74) *Attorney, Agent, or Firm* — Perkins coie LLP

(57) ABSTRACT

A pixel cell readout circuit includes an amplifier and a capacitor switch circuit that includes a first routing path coupled to an input of the amplifier. A second routing path includes switches coupled in series along the second routing path. A first end of the second routing path is coupled to a bitline. A second end of the second routing path is coupled to an output of the amplifier. Only one of the switches is turned off and a remainder of the switches are turned on. Capacitors are coupled in parallel between the first routing path and the second routing path. A first end of each of the capacitors is coupled to the first routing path. A second end of each of the capacitors is coupled to the second routing path. The switches are interleaved among the second ends of the capacitors along the second routing path.

27 Claims, 4 Drawing Sheets

| | GAIN | | | |
|---|---|---|---|---|
| | 1x | 2x | 4x | 8x |
| $C_{IN}$: Cap to Bitline | 5 | 6 | 8 | 8 |
| $C_{FB}$: Cap to Ampout | 5 | 3 | 2 | 1 |
| $C_{GND}$: Cap to GND | 0 | 1 | 0 | 1 |
| SWA | OFF | ON | ON | ON |
| SWB | ON | OFF | ON | ON |
| SWC | ON | ON | OFF | ON |
| SWD | ON | ON | ON | OFF |
| SWG | H | L | H | L |

US 11,290,674 B1

COLUMN AMPLIFIER CAPACITOR SWITCH CIRCUIT TO ADJUST ANALOG GAIN

BACKGROUND INFORMATION

Field of the Disclosure

This disclosure relates generally to image sensors, and in particular but not exclusively, relates to complementary metal oxide semiconductor (CMOS) image sensors with column gain.

Background

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (i.e., image data) representing the external scene. The analog image signals on the column bitlines are coupled to readout circuits, which include input stages having column amplifiers coupled to analog-to-digital conversion (ADC) circuits to convert that analog image signals from the pixel array into the digital image signals.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
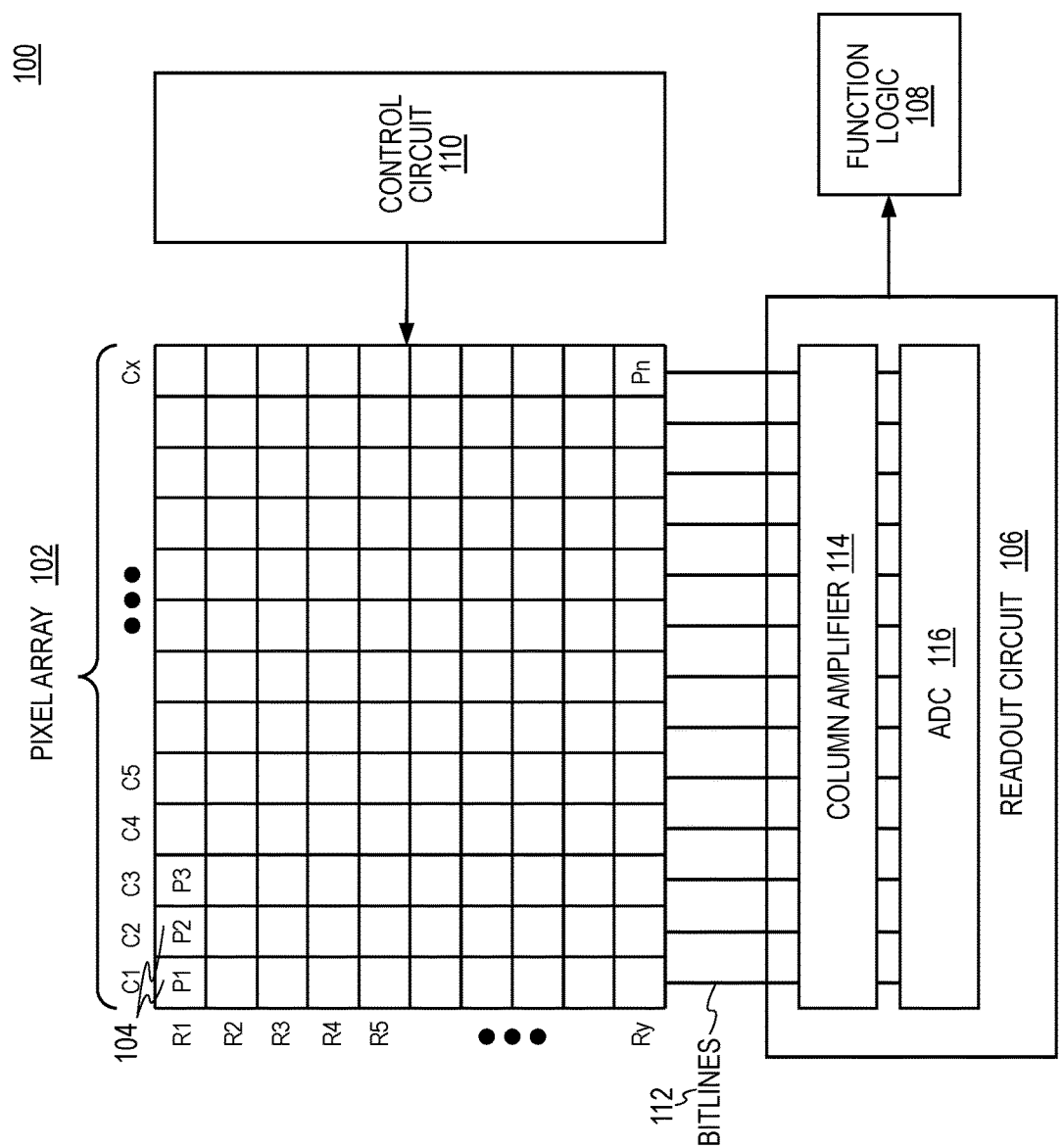
FIG. 1 illustrates one example of an imaging system with a readout circuit including a column amplifier with a capacitor switch circuit in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system with a readout circuit including an amplifier with a capacitor switch circuit providing adjustable gain are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with a readout circuit including an amplifier with a capacitor switch circuit providing adjustable gain are described. In various examples, the capacitor switch circuit includes a first routing path that is coupled to an input of an amplifier and a plurality of m capacitors that are coupled in parallel between the first routing path and a second routing path. In the examples, the second routing path includes a plurality of m−1 switches that are coupled in series along the second routing path. A first end of the second routing path is coupled to a bitline from a pixel array, and a second end of the second routing path is coupled to an output of the amplifier.

In the examples, the plurality of m−1 switches are interleaved among the plurality of m capacitors along the second routing path, and only one of the plurality of m−1 switches is turned off while the remainder of the plurality of m−1 switches are turned on, which divides or separates the second routing path into a first portion and a second portion. A first subset of the plurality of m capacitors is coupled in parallel between the first routing path and the first portion of the second routing path. A second subset of the plurality of m capacitors is coupled in parallel between the first routing path and the second portion of the second routing path.

To illustrate, FIG. 1 illustrates one example of a complementary metal oxide semiconductor (CMOS) imaging system 100 with a readout circuit including an amplifier with a capacitor switch circuit providing adjustable gain in accordance with the teachings of the present invention. In the example, the imaging system 100 includes a pixel array 102, a control circuit 110, a readout circuit 106, and function logic 108. In one example, pixel array 102 is a two-dimensional (2D) array including a plurality of pixel cells 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

After each pixel cell 104 has acquired its image charge, the corresponding analog image signals are read out by readout circuit 106 through column bitlines 112. In one example, readout circuit 106 may read out one row of image charge values at a time along column bitlines 112 (illustrated) or may read out the image charge values using a variety of other techniques (not illustrated), such as a serial read out or a full parallel readout of all pixel cells 104 simultaneously. In the various examples, readout circuit 106 includes a column amplifier 114 that is coupled to bitlines 112 to amplify the analog image signals that are read out from the pixel cells 104 of the pixel array 102. As will be discussed, the column amplifier 114 includes a capacitor switch circuit, which as will be described in greater detail below provides adjustable gain for the column amplifier 114. The readout circuit 106 also includes an analog-to-digital conversion (ADC) circuit 116 that is coupled to convert the amplified analog image signals received from the column amplifier 114 to digital image signals. Thus, the image charge values may be read out from the pixel array 102 with different adjustable gain settings in accordance with teachings of the present invention. The digital representations of the image charge values may then be transferred to function logic 108. Function logic 108 may simply store the image charge values or even manipulate the image data by applying post image effects (e.g., crop, rotate, remove red eye, adjust brightness, adjust contrast, or otherwise).

In one example, a control circuit 110 is coupled to pixel array 102 to control operational characteristics of pixel array 102. For instance, in one example, control circuit 110 generates the transfer gate signals and other control signals to control the transfer and read out of image data from all of the pixel cells 104 of pixel array 102. In addition, control circuit 110 may generate a shutter signal for controlling image acquisition. In one example, the shutter signal is a rolling shutter signal such that each row of the pixel array 102 is read out sequentially row by row during consecutive acquisition windows. The shutter signal may also establish an exposure time, which is the length of time that the shutter remains open. In one embodiment, the exposure time is set to be the same for each of the frames.

Figure 2:
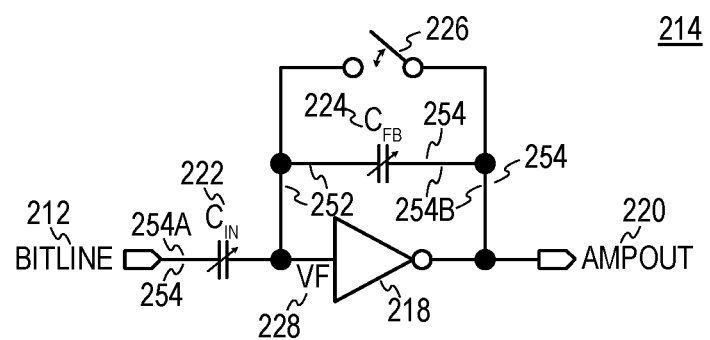
FIG. 2 illustrates one example schematic of an amplifier providing column gain with capacitor switch circuit in accordance with the teachings of the present disclosure.

FIG. 2 illustrates one example schematic of an amplifier 214 providing column gain with capacitor switch circuit in accordance with the teachings of the present disclosure. It is appreciated that the amplifier 214 illustrated in FIG. 2 may be an example of column amplifier 114 included in the readout circuit 106 of FIG. 1, and that similarly named and numbered elements described above are coupled and function similarly below.

As shown in the depicted example, amplifier 214 includes an inverting amplifier 218 having an input coupled to receive an input voltage VF 228 and an output coupled to provide an output voltage AMPOUT 220. In one example, the output AMPOUT 220 is coupled to be received by an ADC circuit included in a readout circuit of an imaging system. In one example, a reset switch 226 is coupled between the input VF 228 and the output AMPOUT 220 of the amplifier 218. The example depicted in FIG. 2 illustrates an adjustable feedback capacitor $C_{FB}$ 224 is also coupled between the input VF 228 and the output AMPOUT 220 of the amplifier 218. In addition, the input VF 228 of amplifier 218 is also capacitively coupled to bitline 212 through an adjustable input capacitor $C_{IN}$ 222.

As summarized above and as will be described in greater detail below, the example depicted in FIG. 2 illustrates a capacitor switch circuit that includes a first routing path 252 that is coupled to the input VF 228 of amplifier 218. In addition, a second routing path 254, which includes a first portion 254A and a second portion 254B, has a first end that is coupled to bitline 212 and a second end that is coupled to the AMPOUT 220 of the amplifier 218. In the various examples, input capacitor $C_{IN}$ 222 is implemented with a first subset of a plurality of m capacitors that are coupled in parallel between the first portion 254A of the second routing path 254 and the first routing path 252. In the various examples, the feedback capacitor $C_{FB}$ 224 is implemented with a second subset of the plurality of m capacitors that are coupled in parallel between the second portion 254B of the second routing path 254 and the first routing path 252.

As will be shown in greater detail below, in various the examples, the second routing path includes a plurality of m−1 switches that are coupled in series along the second routing path. The plurality of m−1 switches are interleaved among the plurality of m capacitors along the second routing path, and only one of the plurality of m−1 switches is turned off while the remainder of the plurality of m−1 switches are turned on, which divides or separates the second routing path 254 into the first portion 254A and the second portion 254B. In the examples, the input capacitor $C_{IN}$ 222 is coupled between the first routing path 252 and the first portion 254A of the second routing path 254, while the feedback capacitor $C_{FB}$ 224 is coupled between the first routing path 252 and the second portion 254B of the second routing path 254.

In operation, depending on which one of the plurality of m−1 switches is turned off, the ratio of the capacitors included in the input capacitor $C_{IN}$ 222 and feedback capacitor $C_{FB}$ 224 is adjusted, which adjusts the gain of the amplifier 214 in accordance with the teachings of the present invention. In the various examples, the gain of the amplifier 214 is adjusted in response to the following equation:

$$\text{Gain} = \frac{C_{IN}}{C_{FB}} \qquad (1)$$

Figures 3A, 3B:
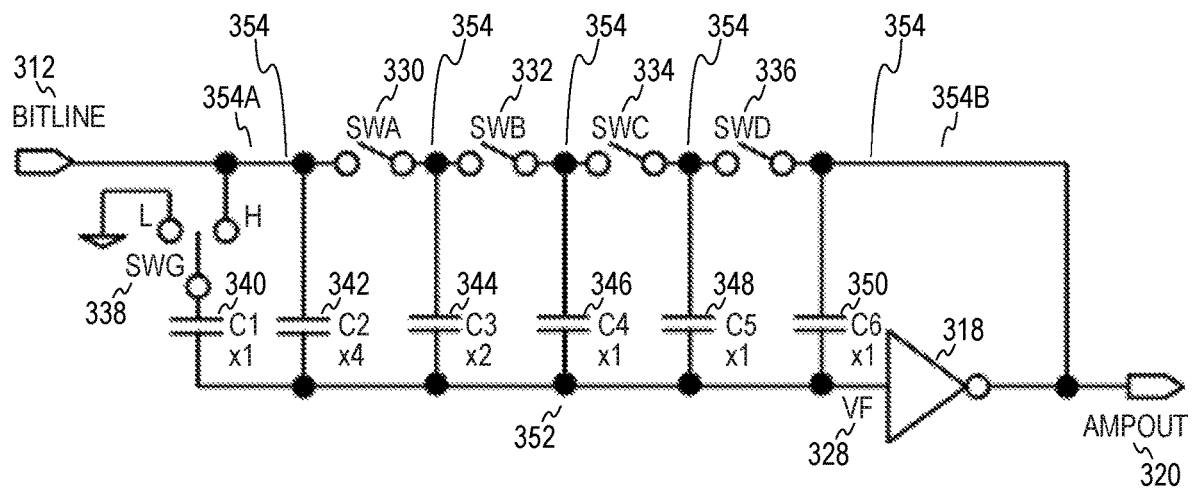
FIG. 3A illustrates another example schematic of an amplifier providing column gain with capacitor switch circuit in accordance with the teachings of the present disclosure.
FIG. 3B illustrates various example switch settings that provide different gain values for the example capacitor switch circuit included in the amplifier shown in FIG. 3A in accordance with the teachings of the present disclosure.

FIG. 3A shows in greater detail another example schematic of an amplifier 314 providing column gain with capacitor switch circuit in accordance with the teachings of the present disclosure. It is appreciated that the amplifier 314 illustrated in FIG. 3A may be an example of amplifier 214 illustrated in FIG. 2 and/or an example of column amplifier 114 included in the readout circuit 106 of FIG. 1, and that similarly named and numbered elements described above are coupled and function similarly below.

As shown in the depicted example, amplifier 314 includes an inverting amplifier 318 having an input coupled to receive an input voltage VF 328 and an output coupled to provide an output voltage AMPOUT 320. In one example, the output AMPOUT 320 is coupled to be received by an ADC circuit included in a readout circuit of an imaging system. In one example, amplifier 314 includes a capacitor switch circuit that includes a first routing path 352, a second routing path 354, a plurality of m capacitors, which includes capacitor C2 342, capacitor C3 344, capacitor C4 346, capacitor C5 348, capacitor C6 350, and a plurality of m−1 switches, which includes switch SWA 330, switch SWB 332, switch SWC 334, and switch SWD 336. In the depicted example, the amplifier 314 also includes an input/ground capacitor C1 340 having a first end coupled to the first routing path 352, and an input/ground select switch SWG 338 that is configured to couple a second end of the input/ground capacitor C1 340 to either the second routing path 354 (labeled as "H" in FIG. 3A) or to ground (labeled as "L" in FIG. 3A).

Specifically, the example depicted in FIG. 3A shows that first routing path 352 is coupled to the VF 328 input of the amplifier 318. The second routing path 354 includes the plurality of m−1 switches, including switches SWA 330, SWB 332, SWC 334, SWD 336, which are coupled in series along the second routing path 354. The example of FIG. 3A shows an example with m=5 such that there are four switches SWA 330, SWB 332, SWC 334, SWD 336 coupled in series along the second routing path 354. In the example, a first end (e.g., left end) of the second routing path 354 is coupled to bitline 312, which in one example is coupled to a pixel array of pixel cells. A second end (e.g., right end) of the second routing path 354 is coupled to the AMPOUT 320 output of the amplifier 318.

As shown, the plurality of m capacitors, including capacitor C2 342, capacitor C3 344, capacitor C4 346, capacitor C5 348, capacitor C6 350, are coupled in parallel between the first routing path 352 and the second routing path 354. The example of FIG. 3A shows an example with m=5 such that there are five capacitors C2 342, C3 344, C4 346, C5 348, C6 350 included in the plurality of m capacitors. In the example, a first end (e.g., bottom end) of each of the plurality of m capacitors C2 342, C3 344, C4 346, C5 348, C6 350 is coupled to the first routing path 352. A second end (e.g., top end) of each of the plurality of m capacitors C2 342, C3 344, C4 346, C5 348, C6 350 is coupled to the second routing path 354.

As shown in the depicted example, the plurality of m−1 switches SWA 330, SWB 332, SWC 334, SWD 336, are interleaved among the second ends of the plurality of m capacitors C2 342, C3 344, C4 346, C5 348, C6 350 along the second routing path 354. In other words, each of the plurality of m−1 switches SWA 330, SWB 332, SWC 334, SWD 336 is coupled between the second ends of respective neighboring capacitors C2 342, C3 344, C4 346, C5 348, C6 350 along the second path 354.

In operation, only one of the plurality of m−1 switches SWA 330, SWB 332, SWC 334, SWD 336 is turned off and the remainder of the plurality of m−1 switches are turned on. As such, the one switch that is turned off divides or separates the second routing path 354 into a first portion 354A and a second portion 354B. As a result, a first subset of the plurality of m capacitors is coupled to the first portion 354A of the second routing path, and a second subset of the plurality of m capacitors is coupled to the second portion 354B of the second routing path 354.

For example, when switch SWA 330 is off, switches SWB 332, SWC 334, and SWD 336 are on. As such, the subset of capacitor C2 342 is coupled to the first portion 354A of second routing path 354, while the subset of capacitors C3 344, C4 346, C5 348, and C6 350 are coupled to the second portion 354B of second routing path 354.

Similarly, when switch SWB 332 is off, switches SWA 330, SWC 334, and SWD 336 are on. As such, capacitors the subset of C2 342 and C3 344 are coupled to the first portion 354A of second routing path 354, while the subset of capacitors C4 346, C5 348, and C6 350 are coupled to the second portion 354B of second routing path 354.

Similarly, when switch SWC 334 is off, switches SWA 330, SWB 332, and SWD 336 are on. As such, the subset of capacitors C2 342, C3 344, and C4 346 are coupled to the first portion 354A of second routing path 354, while the subset of capacitors C5 348, and C6 350 are coupled to the second portion 354B of second routing path 354.

Similarly, when switch SWD 336 is off, switches SWA 330, SWB 332, and SWC 334 are on. As such, the subset of capacitors C2 342, C3 344, C4 346, and C5 348 are coupled to the first portion 354A of second routing path 354, while the subset of capacitor C6 350 is coupled to the second portion 354B of second routing path 354.

In addition and as summarized above, it is noted that example depicted in FIG. 3A also shows that the input/ground select switch SWG 338 may also be configured to couple the second end of the input/ground capacitor C1 340 to the first portion 354A of the second routing path 354 (e.g., "H") or to ground (e.g., "L").

In the example illustrated in FIG. 3A, the capacitor C2 342 has a capacitance value substantially equal to four times (×4) a capacitance value of the input/ground capacitor C1 340 (×1). The capacitor C3 344 has a capacitance value substantially equal to two times (×2) the capacitance value of the input/ground capacitor C1 340. The capacitors C4 346, C5 348, and C6 350 have capacitance values substantially equal (×1) to the capacitance value of the input/ground capacitor C1 340.

Referring briefly back to the example as illustrated in FIG. 2, the input capacitor $C_{IN}$ 222 is provided with the capacitance coupled between first routing path 352 and the first portion 354A of the second routing path 354. Similarly, the feedback capacitor $C_{FB}$ 224 is provided with the capacitance coupled between first routing path 352 and the second portion 354B of the second routing path 354.

For instance, in an example in which switch SWB 332 is off, switches SWA 330, SWC 334, and SWD 336 are on, and input/ground select switch SWG 338 is configured to couple the input/ground capacitor C1 340 to the first portion 354A of the second routing path 354, the capacitance value of input capacitor $C_{IN}$ 222 is substantially equal to the sum of the parallel coupled capacitors C1+C2+C3 and the capacitance value of feedback capacitor $C_{FB}$ 224 is substantially equal to the sum of parallel coupled capacitors C4+C5+C6. Thus, in this example, with switch SWB 332 off, switches SWA 330, SWC 334, and SWD 336 on, and input/ground select switch SWG 338 coupled to "H" in FIG. 3A, the gain of amplifier 314 would be adjusted according to the following equation:

$$\text{Gain} = \frac{C1 + C2 + C3}{C4 + C5 + C6} \quad (2)$$

FIG. 3B illustrates various example switch settings that provide different gain values for the example capacitor switch circuit included in the amplifier 314 shown in FIG. 3A in accordance with the teachings of the present disclosure. Specifically, assuming the gain relationship of:

$$\text{Gain} = \frac{C_{IN}}{C_{FB}} \quad (3)$$

the example shown in FIG. 3B shows that a gain of 1× (e.g., 5/5) can be provided with amplifier 314 with SWA=off, SWB/SWC/SWD=on, and SWG=H. A gain of 2× (e.g., 6/3) can be provided with amplifier 314 with SWB=off, SWA/SWC/SWD=on, and SWG=L. A gain of 4× (e.g., 8/2) can be provided with amplifier 314 with SWC=off, SWA/SWB/SWD=on, and SWG=H. A gain of 8× (e.g., 8/1) can be provided with amplifier 314 with SWD=off, SWA/SWB/SWC=on, and SWG=L.

Figure 3C:
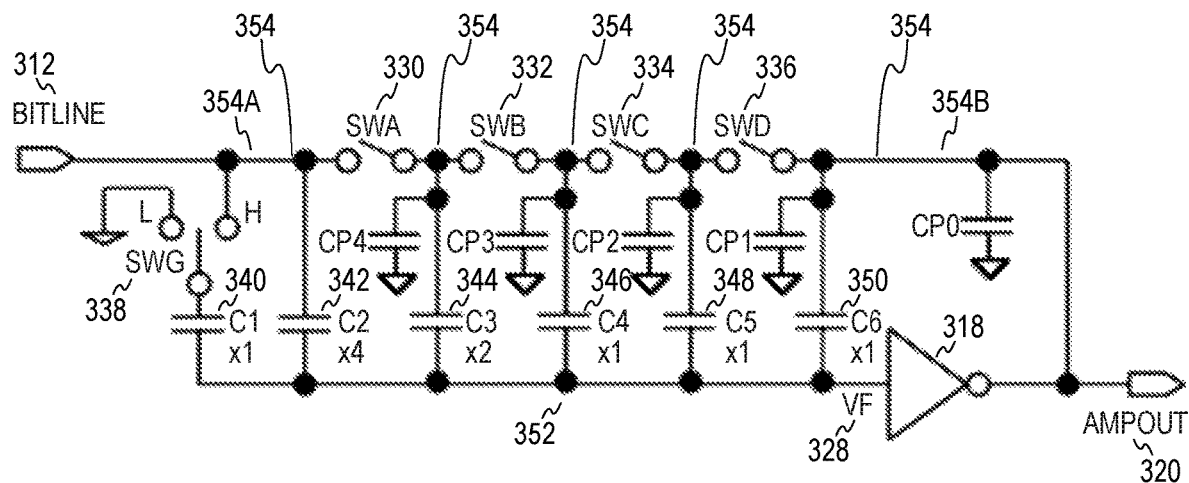
FIG. 3C illustrates yet another example schematic of an amplifier providing column gain with capacitor switch circuit in accordance with the teachings of the present disclosure.

FIG. 3C illustrates yet another example schematic of amplifier 314 providing column gain with capacitor switch circuit in accordance with the teachings of the present disclosure. It is appreciated that the amplifier 314 illustrated in FIG. 3C may be an example of amplifier 314 illustrated in FIG. 3A and/or an example of amplifier 214 illustrated in FIG. 2 and/or an example of column amplifier 114 included in the readout circuit 106 of FIG. 1, and that similarly named and numbered elements described above are coupled and function similarly below.

Specifically, it is noted that the amplifier 314 illustrated in FIG. 3C is similar to amplifier 314 illustrated in FIG. 3A, and that the amplifier 314 illustrated in FIG. 3C also shows example parasitic capacitances in the schematic. In particular, the example depicted in FIG. 3C shows that there is a parasitic capacitance CP0 at the AMPOUT 320 output of amplifier 318, a parasitic capacitance CP1 at the end of capacitor C6 350 that is coupled to second routing path 354, a parasitic capacitance CP2 at the end of capacitor C5 348 that is coupled to second routing path 354 between switch SWC 334 and switch SWD 336, a parasitic capacitance CP3 at the end of capacitor C4 346 that is coupled to second routing path 354 between switch SWB 332 and switch SWC 334, and a parasitic capacitance CP4 at the end of capacitor C3 344 that is coupled to second routing path 354 between switch SWA 330 and switch SWB 332.

As described above, one of the plurality of m−1 switches SWA 330, SWB 332, SWC 334, SWD 336 is always off during operation depending on the gain. In this way, especially at higher gain settings, the parasitic capacitance coupled to the AMPOUT 320 output of amplifier 318 is minimized in accordance with the teachings of the present invention. For example, as summarized in FIG. 3B, for a gain of 8×, switch SWD 336 is off, which disconnects parasitic capacitances CP2, CP3, and CP4, as well as the parasitic capacitances of CMOS switches SWA 330, SWB 332, and SWC 334 from the AMPOUT 320 output of amplifier 318. This reduces the amount of the capacitance coupled to the AMPOUT 320 output of amplifier 318, especially at higher gain settings, in accordance with the teachings of the present invention.

In addition, it is further appreciated that another benefit with the serial coupling of switches SWA 330, SWB 332, SWC 334, SWD 336 along the second routing path 354 as shown described above, the number of routing paths that need to be routed in parallel can be reduced from three to two, which further reduces the parasitic capacitance coupled to the AMPOUT 320 output of amplifier 318 compared other configurations that have three parallel routing paths between bitline 312, AMPOUT 320, and VF 328.

It is noted that the bandwidth of the conventional amplifiers is reduced as closed loop gain is increased. In comparison, in the examples shown and described above, the bandwidth of, for example, amplifier 314 can be increased especially at higher closed loop gain settings (e.g., 2×, 4×, 8×) since the capacitance at AMPOUT 320 is reduced by switching off one of the serially coupled switches SWA 330, SWB 332, SWC 334, SWD 336 along the second routing path 354. This reduced capacitance at AMPOUT 320 of amplifier 314 at higher closed gain settings therefore increases image sensor frame rate in accordance with the teachings of the present invention.

Moreover, it is also appreciated that minimum power consumption of a column amplifier is conventionally limited by bandwidth. With the increased bandwidth of amplifier 314 as described above due to the decreased capacitance at AMPOUT 320 by switching off one of the serially coupled switches SWA 330, SWB 332, SWC 334, SWD 336 along the second routing path 354, it is further appreciated that power consumption is also significantly reduced with examples of amplifier 314 at higher closed gain settings in accordance with the teachings of the present invention.

Figure 4:
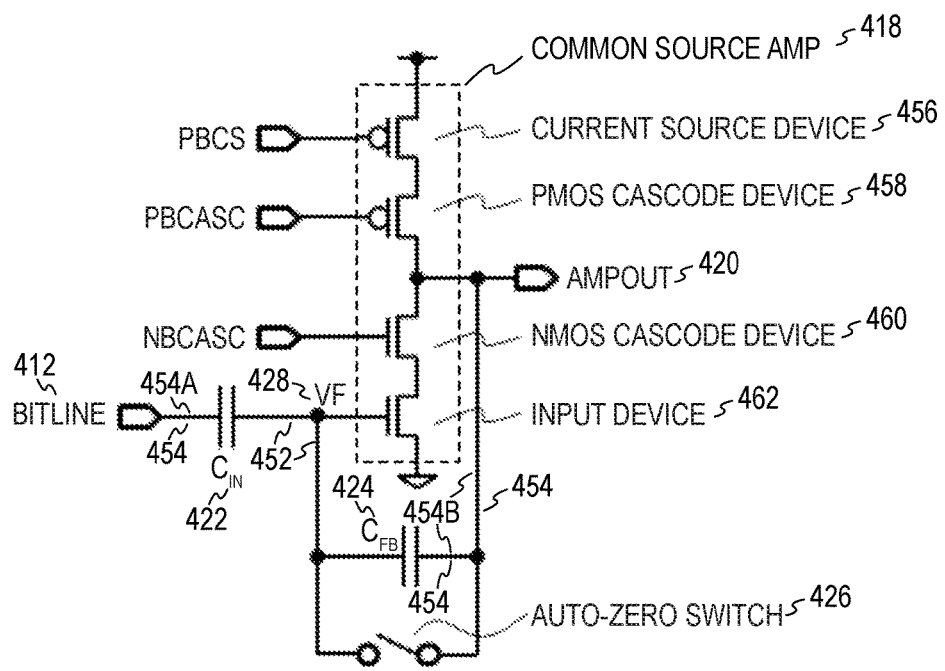
FIG. 4 illustrates still another example schematic of an amplifier providing column gain with capacitor switch circuit in accordance with the teachings of the present disclosure.

FIG. 4 illustrates still another example schematic of an amplifier 414 providing column gain with capacitor switch circuit in accordance with the teachings of the present disclosure. It is appreciated that the amplifier 414 illustrated in FIG. 4 may be an example of amplifier 314 illustrated in FIGS. 3A and 3C and/or an example of amplifier 214 illustrated in FIG. 2 and/or an example of column amplifier 114 included in the readout circuit 106 of FIG. 1, and that similarly named and numbered elements described above are coupled and function similarly below.

In particular, it is noted that amplifier 414 illustrated in FIG. 4 has many similarities with amplifier 214 illustrated in FIG. 2. For instance, FIG. 4 shows that amplifier 414 includes an inverting common source amplifier 418 having an input coupled to receive an input voltage VF 428 and an output coupled to provide an output voltage AMPOUT 420. In one example, the output AMPOUT 420 is coupled to be received by an ADC circuit included in a readout circuit of an imaging system. The example depicted in FIG. 4 illustrates an adjustable feedback capacitor $C_{FB}$ 424 is also coupled between the input VF 428 and the output AMPOUT 420 of the amplifier 418. In addition, the input VF 428 of amplifier 418 is also capacitively coupled to bitline 412 through an adjustable input capacitor $C_{IN}$ 422.

In the various examples, the adjustable input capacitor $C_{IN}$ 422 and the adjustable feedback capacitor $C_{FB}$ 424 are implemented with a capacitor switch circuit as described above in FIGS. 3A-3C. For instance, with respect to FIG. 4, the capacitor switch circuit includes a first routing path 452 that is coupled to the input VF 428 of amplifier 418. In addition, a second routing path 454, which includes a first portion 454A and a second portion 454B, has a first end that is coupled to bitline 412 and a second end that is coupled to the AMPOUT 420 of the amplifier 418. In the various examples, input capacitor $C_{IN}$ 422 is implemented with a first subset of a plurality of m capacitors that are coupled in parallel between the first portion 454A of the second routing path 454 and the first routing path 452. In the various examples, the feedback capacitor $C_{FB}$ 424 is implemented with a second subset of the plurality of m capacitors that are coupled in parallel between the second portion 454B of the second routing path 454 and the first routing path 452.

In the examples, similar to the examples described above in FIGS. 3A-3C, the second routing path 454 includes a plurality of m−1 switches that are coupled in series along the second routing path 454. The plurality of m−1 switches are interleaved among the plurality of m capacitors along the second routing path 454, and only one of the plurality of m−1 switches is turned off while the remainder of the plurality of m−1 switches are turned on, which divides or separates the second routing path 454 into the first portion 454A and the second portion 454B. In the examples, the input capacitor $C_{IN}$ 422 is coupled between the first routing path 452 and the first portion 454A of the second routing path 454, while the feedback capacitor $C_{FB}$ 424 is coupled between the first routing path 452 and the second portion 454B of the second routing path 454. In operation, depending on which one of the plurality of m−1 switches is turned off, the ratio of the capacitors included in the input capacitor $C_{IN}$ 422 and feedback capacitor $C_{FB}$ 424 is adjusted, which adjusts the gain of the amplifier 414 in accordance with the teachings of the present invention according to the following equation:

$$\text{Gain} = \frac{C_{IN}}{C_{FB}} \quad (4)$$

In the example depicted in FIG. 4, an example transistor level schematic of the common source amplifier 418 is provided. As shown in the depicted example, amplifier 414 includes common source amplifier 418 which includes an input device 462, a current source device 456, an NMOS cascode device 460, and a PMOS cascode device 458.

As shown in the depicted example, input device 462 may also be referred to as a first transistor 462 having a gate that is coupled to the first routing path 452, and a source that is coupled to ground. The NMOS cascode device 460 may also be referred to as a second transistor 460 having a source that is coupled to a drain of the first transistor 462. A gate of the second transistor 460 is coupled to receive a first cascode bias voltage NBCASC. A drain of the second transistor 460 is coupled to the second routing path 454. The PMOS cascode device 458 may also be referred to as a third transistor 458 having a drain that is coupled to the drain of the second transistor 460. A gate of the third transistor 458 is coupled to receive a second cascode bias voltage PBCASC. The current source device 456 may also be referred to as a fourth transistor 456 having a source that is coupled to a supply voltage. A gate of the fourth transistor 456 is coupled to receive a current source bias voltage PBCS. A drain of the fourth transistor 456 is coupled to a source of the third transistor 458.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell readout circuit, comprising:
   an amplifier; and
   a capacitor switch circuit, comprising:
     a first routing path coupled to an input of the amplifier;
     a second routing path including a plurality of m−1 switches coupled in series along the second routing path, wherein a first end of the second routing path is coupled to a bitline from a pixel array of pixel cells, wherein a second end of the second routing path is coupled to an output of the amplifier, wherein only one of the plurality of m−1 switches is turned off and a remainder of the plurality of m−1 switches are turned on; and
     a plurality of m capacitors coupled in parallel between the first routing path and the second routing path, wherein a first end of each of the plurality of m capacitors is coupled to the first routing path, wherein a second end of each of the plurality of m capacitors is coupled to the second routing path, wherein the plurality of m−1 switches are interleaved among the second ends of the plurality of m capacitors along the second routing path.

2. The pixel cell readout circuit of claim 1, wherein the capacitor switch circuit further comprises:
   an input/ground capacitor having a first end coupled to a first end of the first routing path, wherein a second end of the first routing path is coupled to the input of the amplifier; and
   an input/ground select switch coupled to a second end of the input/ground capacitor, wherein the input/ground select switch is configured to couple the second end of the input/ground capacitor to either the first end of the second routing path or to ground.

3. The pixel cell readout circuit of claim 2, wherein each of the plurality of m−1 switches is coupled between the second ends of respective neighboring capacitors of the plurality of m capacitors.

4. The pixel cell readout circuit of claim 2, wherein said only one of the plurality of m−1 switches that is turned off divides the second routing path into a first portion and a second portion.

5. The pixel cell readout circuit of claim 4, wherein a first subset of the plurality of m capacitors is coupled to the first portion of the second routing path, wherein a second subset of the plurality of m capacitors is coupled to the second portion of the second routing path.

6. The pixel cell readout circuit of claim 5, wherein when the second end of the input/ground capacitor is coupled to the first end of the second routing path through the input/ground select switch, an analog gain of the amplifier is substantially equal to a sum of capacitance values of the input/ground capacitor and the first subset of the plurality of m capacitors divided by a sum of capacitance values of the second subset of the plurality of m capacitors.

7. The pixel cell readout circuit of claim 5, wherein when the second end of the input/ground capacitor is coupled to ground through the input/ground select switch, an analog gain of the amplifier is substantially equal to a sum of capacitance values of the first subset of the plurality of m capacitors divided by a sum of capacitance values of the second subset of the plurality of m capacitors.

8. The pixel cell readout circuit of claim 5, wherein m=5, the plurality of m capacitors includes five capacitors, and the plurality of m−1 switches includes four switches.

9. The pixel cell readout circuit of claim 8,
wherein a first one of the plurality of m capacitors has a capacitance value substantially equal to four times a capacitance value of the input/ground capacitor,
wherein a second one of the plurality of m capacitors has a capacitance value substantially equal to two times the capacitance value of the input/ground capacitor,
wherein a third one of the plurality of m capacitors, a fourth one of the plurality of m capacitors, and a fifth one of the plurality of m capacitors have a capacitance values substantially equal to the capacitance value of the input/ground capacitor.

10. The pixel cell readout circuit of claim 9, wherein the second ends of the first one of the plurality of m capacitors, the second one of the plurality of m capacitors, the third one of the plurality of m capacitors, the fourth one of the plurality of m capacitors, and the fifth one of the plurality of m capacitors are arranged in order from the first end of the second routing path towards the second end of the second routing path.

11. The pixel cell readout circuit of claim 10, wherein a first one of the plurality of m−1 switches, a second one of the plurality of m−1 switches, a third one of the plurality of m−1 switches, and a fourth one of the plurality of m−1 switches, are arranged in order along the second routing path from the first end of the second routing path towards the second end of the second routing path.

12. The pixel cell readout circuit of claim 11,
wherein an analog gain of the amplifier is substantially equal to one when the first one of the plurality of switches is off and the second end of the input/ground capacitor is coupled to the first end of the second routing path through the input/ground select switch,
wherein the analog gain of the amplifier is substantially equal to two when the second one of the plurality of switches is off and the second end of the input/ground capacitor is coupled to ground through the input/ground select switch,
wherein the analog gain of the amplifier is substantially equal to four when the third one of the plurality of switches is off and the second end of the input/ground capacitor is coupled to the first end of the second routing path through the input/ground select switch,
wherein the analog gain of the amplifier is substantially equal to eight when the fourth one of the plurality of switches is off and the second end of the input/ground capacitor is coupled to ground through the input/ground select switch.

13. The pixel cell readout circuit of claim 1, wherein the amplifier comprises:
a first transistor having a gate coupled to the first routing path, wherein a source of the first transistor is coupled to ground;
a second transistor having a source coupled to a drain of the first transistor, wherein a gate of the second transistor is coupled to receive a first cascode bias voltage, wherein a drain of the second transistor is coupled to the second routing path;
a third transistor having a drain coupled to the drain of the second transistor, wherein a gate of the third transistor is coupled to receive a second cascode bias voltage; and
a fourth transistor having a source coupled to a supply voltage, wherein a gate of the fourth transistor is coupled to receive a current source bias voltage, wherein a drain of the fourth transistor is coupled to a source of the third transistor.

14. An imaging system, comprising:
a pixel array including a plurality of pixel cells arranged in rows and columns, wherein each one of the pixel cells is coupled to generate an image signal in response to incident light;
a control circuit coupled to the pixel array to control operation of the pixel array; and
a readout circuit coupled to the pixel array, wherein the readout circuit comprises:
an amplifier; and
a capacitor switch circuit, comprising:
a first routing path coupled to an input of the amplifier;
a second routing path including a plurality of m−1 switches coupled in series along the second routing path, wherein a first end of the second routing path is coupled to a bitline from a pixel array of pixel cells, wherein a second end of the second routing path is coupled to an output of the amplifier, wherein only one of the plurality of m−1 switches is turned off and a remainder of the plurality of m−1 switches are turned on; and
a plurality of m capacitors coupled in parallel between the first routing path and the second routing path, wherein a first end of each of the plurality of m capacitors is coupled to the first routing path, wherein a second end of each of the plurality of m capacitors is coupled to the second routing path, wherein the plurality of m−1 switches are interleaved among the second ends of the plurality of m capacitors along the second routing path.

15. The imaging system of claim 14, further comprising function logic coupled to the readout circuit to store the image data read out from the pixel array.

16. The imaging system of claim 14, wherein the capacitor switch circuit further comprises:
an input/ground capacitor having a first end coupled to a first end of the first routing path, wherein a second end of the first routing path is coupled to the input of the amplifier; and
an input/ground select switch coupled to a second end of the input/ground capacitor, wherein the input/ground select switch is configured to couple the second end of the input/ground capacitor to either the first end of the second routing path or to ground.

17. The imaging system of claim 16, wherein each of the plurality of m−1 switches is coupled between the second ends of respective neighboring capacitors of the plurality of m capacitors.

18. The imaging system of claim 16, wherein said only one of the plurality of m−1 switches that is turned off divides the second routing path into a first portion and a second portion.

19. The imaging system of claim 18, wherein a first subset of the plurality of m capacitors is coupled to the first portion of the second routing path, wherein a second subset of the plurality of m capacitors is coupled to the second portion of the second routing path.

20. The imaging system of claim 19, wherein when the second end of the input/ground capacitor is coupled to the first end of the second routing path through the input/ground select switch, an analog gain of the amplifier is substantially equal to a sum of capacitance values of the input/ground capacitor and the first subset of the plurality of m capacitors divided by a sum of capacitance values of the second subset of the plurality of m capacitors.

21. The imaging system of claim 19, wherein when the second end of the input/ground capacitor is coupled to ground through the input/ground select switch, an analog gain of the amplifier is substantially equal to a sum of capacitance values of the first subset of the plurality of m capacitors divided by a sum of capacitance values of the second subset of the plurality of m capacitors.

22. The imaging system of claim 19, wherein m=5, the plurality of m capacitors includes five capacitors, and the plurality of m−1 switches includes four switches.

23. The imaging system of claim 22,
wherein a first one of the plurality of m capacitors has a capacitance value substantially equal to four times a capacitance value of the input/ground capacitor,
wherein a second one of the plurality of m capacitors has a capacitance value substantially equal to two times the capacitance value of the input/ground capacitor,
wherein a third one of the plurality of m capacitors, a fourth one of the plurality of m capacitors, and a fifth one of the plurality of m capacitors have a capacitance values substantially equal to the capacitance value of the input/ground capacitor.

24. The imaging system of claim 23, wherein the second ends of the first one of the plurality of m capacitors, the second one of the plurality of m capacitors, the third one of the plurality of m capacitors, the fourth one of the plurality of m capacitors, and the fifth one of the plurality of m capacitors are arranged in order from the first end of the second routing path towards the second end of the second routing path.

25. The imaging system of claim 24, wherein a first one of the plurality of m−1 switches, a second one of the plurality of m−1 switches, a third one of the plurality of m−1 switches, and a fourth one of the plurality of m−1 switches, are arranged in order along the second routing path from the first end of the second routing path towards the second end of the second routing path.

26. The imaging system of claim 25,
wherein an analog gain of the amplifier is substantially equal to one when the first one of the plurality of switches is off and the second end of the input/ground capacitor is coupled to the first end of the second routing path through the input/ground select switch,
wherein the analog gain of the amplifier is substantially equal to two when the second one of the plurality of switches is off and the second end of the input/ground capacitor is coupled to ground through the input/ground select switch,
wherein the analog gain of the amplifier is substantially equal to four when the third one of the plurality of switches is off and the second end of the input/ground capacitor is coupled to the first end of the second routing path through the input/ground select switch,
wherein the analog gain of the amplifier is substantially equal to eight when the fourth one of the plurality of switches is off and the second end of the input/ground capacitor is coupled to ground through the input/ground select switch.

27. The imaging system of claim 14, wherein the amplifier comprises:
a first transistor having a gate coupled to the first routing path, wherein a source of the first transistor is coupled to ground;
a second transistor having a source coupled to a drain of the first transistor, wherein a gate of the second transistor is coupled to receive a first cascode bias voltage, wherein a drain of the second transistor is coupled to the second routing path;
a third transistor having a drain coupled to the drain of the second transistor, wherein a gate of the third transistor is coupled to receive a second cascode bias voltage; and
a fourth transistor having a source coupled to a supply voltage, wherein a gate of the fourth transistor is coupled to receive a current source bias voltage, wherein a drain of the fourth transistor is coupled to a source of the third transistor.

\* \* \* \* \*